United States Patent [19]

Baker

[11] Patent Number: 4,739,917
[45] Date of Patent: Apr. 26, 1988

[54] DUAL SOLDER PROCESS FOR CONNECTING ELECTRICALLY CONDUCTING TERMINALS OF ELECTRICAL COMPONENTS TO PRINTED CIRCUIT CONDUCTORS

[75] Inventor: Jay D. Baker, Rochester Hills, Mich.
[73] Assignee: Ford Motor Company, Dearborn, Mich.
[21] Appl. No.: 2,486
[22] Filed: Jan. 12, 1987
[51] Int. Cl.⁴ .................. B23K 1/02; B23K 31/02; B23K 35/26
[52] U.S. Cl. .................. 228/123; 228/180.2; 228/187; 228/226; 228/248
[58] Field of Search ............ 228/122, 123, 124, 180.2, 228/215, 226, 187, 248

[56] References Cited

U.S. PATENT DOCUMENTS

| | | | |
|---|---|---|---|
| 3,392,442 | 7/1968 | Napier et al. | 228/227 |
| 3,621,564 | 11/1971 | Tanaka et al. | 228/180.2 |
| 3,702,500 | 11/1972 | Gorinas et al. | 228/180.2 |
| 4,000,842 | 1/1977 | Burns | 228/180.2 |
| 4,139,881 | 2/1979 | Shimizu et al. | 228/180.2 |
| 4,164,778 | 8/1979 | Sawairi et al. | 228/180.2 |
| 4,208,005 | 6/1980 | Nate et al. | 228/180.2 |
| 4,311,267 | 1/1982 | Lim | 228/248 |
| 4,376,505 | 3/1983 | Wojcik | 228/180.2 |
| 4,402,450 | 9/1983 | Abraham et al. | 228/180.2 |
| 4,413,309 | 11/1983 | Takahashi et al. | 228/180.2 |
| 4,494,688 | 1/1985 | Hatada et al. | 228/180.2 |
| 4,605,153 | 8/1986 | Van Den Brekel et al. | 228/180.2 |
| 4,607,782 | 8/1986 | Mims | 228/248 |

OTHER PUBLICATIONS

Investigation of Discrete Component Chip Mounting Technology for Hybrid Microelectronic Circuits, by Salvadore V. Caruso et al, NASA-TM-X-64937, May 1975.

Primary Examiner—Nicholas P. Godici
Assistant Examiner—Samuel M. Heinrich
Attorney, Agent, or Firm—Paul K. Godwin, Jr.; Clifford L. Sadler

[57] ABSTRACT

A method of providing improved electrical and physical connections between the electrically conducting terminals of an electronic component and the conductors of a printed circuit board by utilizing a high temperature solder material formed in mounds on defined areas of the conductors, coating the mounds with low temperature solder paste and mating the terminals of the component to the mounds by forcing them through the low temperature solder coatings prior to reflowing and cooling the low temperature solder.

10 Claims, 2 Drawing Sheets

DUAL SOLDER PROCESS FOR CONNECTING ELECTRICALLY CONDUCTING TERMINALS OF ELECTRICAL COMPONENTS TO PRINTED CIRCUIT CONDUCTORS

BACKGROUND OF THE INVENTION

1. Field of the Invention

The present invention is directed to the field of soldering processes for connecting electrical components to printed circuit conductors.

2. Description of the Prior Art

Much work has been done in recent years to improve the processing approach for soldering surface mounted devices and integrated circuits to printed circuit board conductors.

In U.S. Pat. Nos. 4,139,881; 4,164,778; and 4,208,005, processing techniques are described in which surface mounted components, each having a pair of conductive terminal ends, are attached to a printed circuit board surface with an adhesive prior to subjecting the components to the soldering process.

The NASA publication TMX-64937 by Caruso et al entitled "Investigation of Discrete Component Chip Mounting Technology for Hybrid Microelectronic Circuits" discloses that low temperature solder paste or conductive epoxy could be used to connect the electrical terminal ends of the surface mounted component to the respective printed circuit conductors.

In each of the above methods of attachment, it has been noted that slippage sometimes occurs during placement of the component on the board due to the displacement and spreading of the glue or solder paste. Such slippage results in misalignment of the component with regard to the printed circuit conductors as well as a poor physical and electrical connection which lowers the yield of the printed circuit boards produced during the process.

SUMMARY OF THE INVENTION

In the present invention, a dual solder technique is employed which eliminates the need for adhesively attaching the components to the printed circuit board prior to soldering. As such, the elimination of chemically reactive adhesive resins to hold the components to the board prior to soldering is a welcome and cost effective improvement.

The present invention also allows the components, when placed on the board, to be properly guided and located to assure connection integrity.

The process employed in the present invention to connect electrically conductive terminals of electrical components to printed circuit conductors comprises the steps of forming predetermined conductor patterns on the dielectric surface of a substrate, depositing mounds of solder having a relatively high melting temperature above a first predetermined level onto preselected areas of the conductor pattern, depositing a coating of a solder paste material having a relatively low melting temperature that is below the first predetermined level onto the mounds of high temperature solder, mating the terminal portions of an electrical component with the high temperature solder mound by compressibly forcing the terminal portion through the lower temperature solder paste coating and heating the low temperature solder paste coating to a temperature above its melting temperature so as to create a bond between the terminal portion of the electrical component and the high temperature solder mound.

The placement of the high temperature solder mounds is also shown as being selected so that a plurality of mounds will act to guide and position the conducting terminals of electrical components as they are forced into position through the low temperature solder paste coating.

The low temperature solder paste provides some adhesion of the electrical component prior to the step of heating such solder paste to a point where it melts and reflows to form a permanent bond between the electrically conducting terminal of the electrical component and the high temperature solder mound.

DETAILED DESCRIPTION OF THE PREFERRED EMBODIMENT

The present invention involves a unique dual solder processing method for use with surface mounted electrical component devices and integrated circuits to provide improved terminal connections to printed circuit board or thick film conductors. One of the major advantages of the present invention is the improvement in accurate placement and alignment of surface mounted and integrated circuit components prior to soldering.

In addition, the present invention also offers the advantage of significantly retarding dissolution of siver alloy conductors on substrate surfaces when soldering with high tin content solders.

Figure 1:
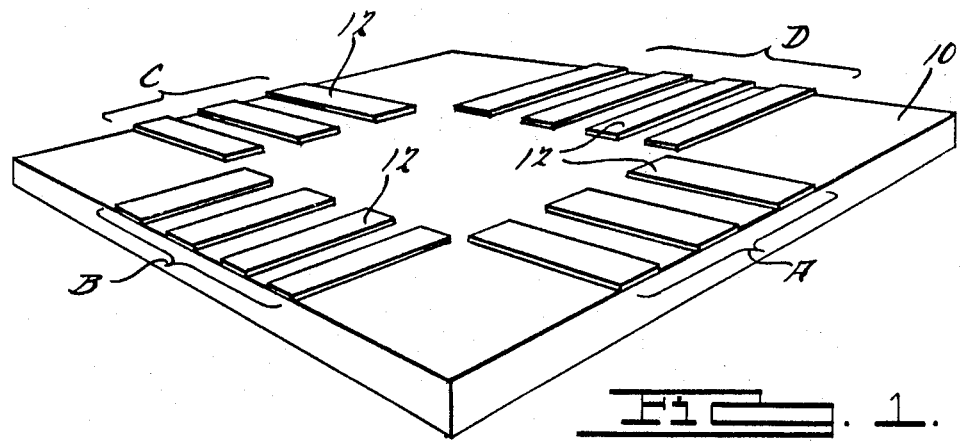
FIG. 1 illustrates a substrate having an insulative dielectric surface with conductive elements formed thereon.

FIG. 1 illustrates a substrate 10 having a nonconductive dielectric surface onto which a pattern of conductor elements 12 have been bonded in a predetermined and conventional manner. Typically, the conductors 12 are of a palladium/silver alloy deposited on the substrate 10 in the form of a conductor paste. Subsequently, the paste is cured or sintered to form the bond to the substrate. In FIG. 1, the conductor elements 12 are shown as as being disposed in Groups A, B, C, and D. The pattern shown in FIG. 1 is typical of that which supports the interconnection of the corresponding electrical terminals extending from an integrated circuit.

Figure 2:
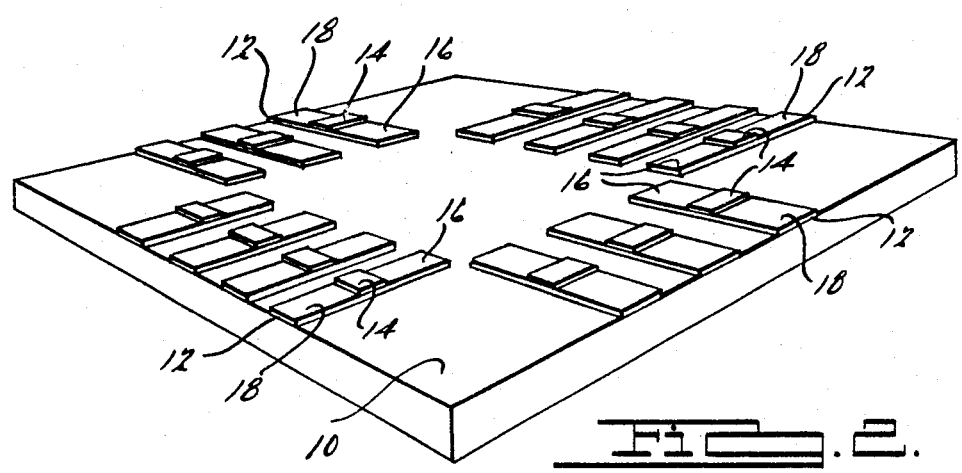
FIG. 2 illustrates the printed circuit substrate of FIG. 1 after predetermined areas of the conductive elements have been defined for receiving solder.

In FIG. 2, the substrate 10 is again shown with the electrical conductor pattern, as shown in FIG. 1, subsequent to the deposition of a dielectric material or "solder stop" 14 on each conductor to define preselected areas 16 and 18 of the conductor 12 which will accept solder during a later step of the process.

Figure 3:
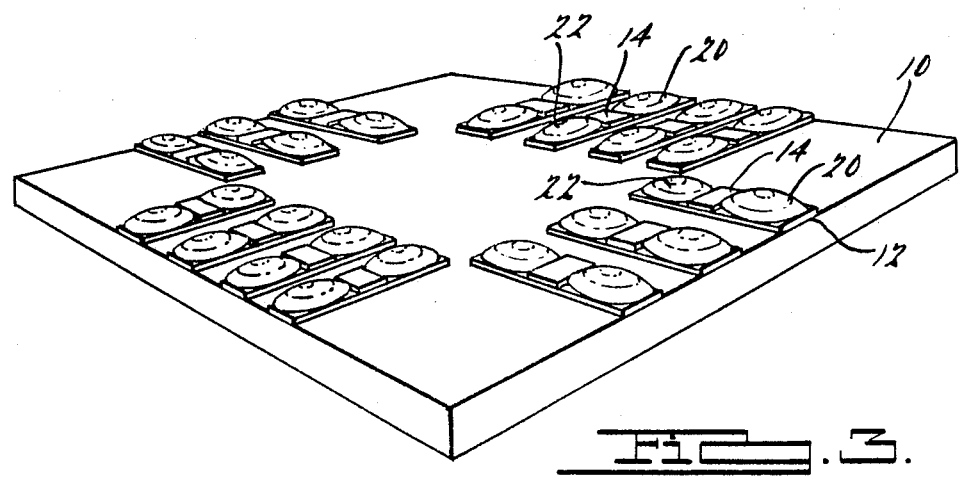
FIG. 3 illustrates the printed circuit substrate of FIG. 2 subsequent to having mounds of high temperature solder deposited on the defined areas of the conductive elements.

Subsequent to the deposition of the solder stop areas 14, a "high temperature" solder is deposited in mounds on the preselected areas of the conductor pattern. FIG. 3 illustrates the mounds formed on areas 16 and 18 of each conductor 12. The solder employed to form the mounds 20 and 22 is termed "high temperature" solder in that its melting temperature is greater than 200° C. In the preferred embodiment, the high temperature solder may have a composition of approximately 10% tin, 88% lead and 2% silver or 5% tin and 95% lead. The high temperature solder employed in the preferred embodiment has a melting temperature of approximately 320° C. When cooled, the mounds 20 and 22 retain their distinctive elevated and somewhat spherical shapes. The case shown in FIG. 3, has high temperature solder mounds 20 and 22 formed on adjacent areas to form a valley across the dielectric material 14.

Figure 4:
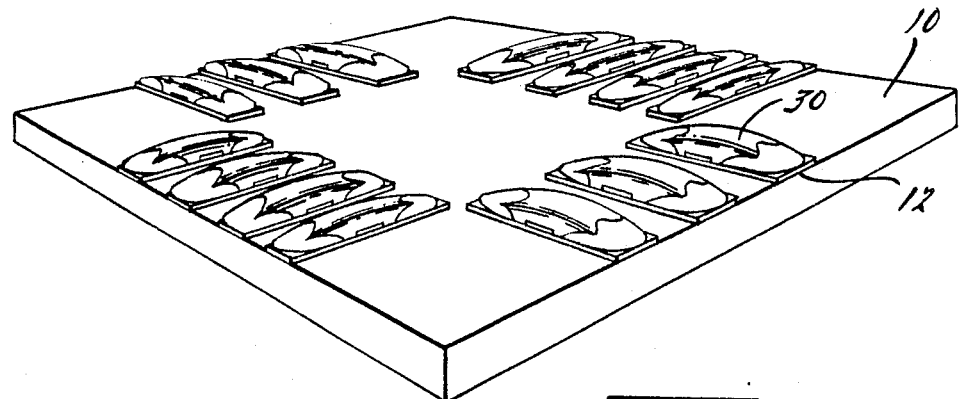
FIG. 4 illustrates the printed circuit substrate shown in FIG. 3 subsequent to having the low temperature solder coated over the high temperature solder mounds.

Following the deposition of the high temperature solder mounds, a "low temperature" solder material is coated onto the mounds 20 and 22. In FIG. 4, the low temperature solder material 30 is shown as being coated over the mounds 20 and 22 and in addition, extending between the adjacent mounds 20 and 22 to cover the dielectric material 14 and fill the valley between the mounds.

The "low temperature" solder is so named because its melt temperature is generally below 200° C. In the illustrated embodiment, a dry or wet solder paste is employed which may have a composition of approximately 62% tin, 36% lead and 2% silver or 60% tin and 40% lead These compositions have a melt temperature of approximately 183° C.

Figure 5:
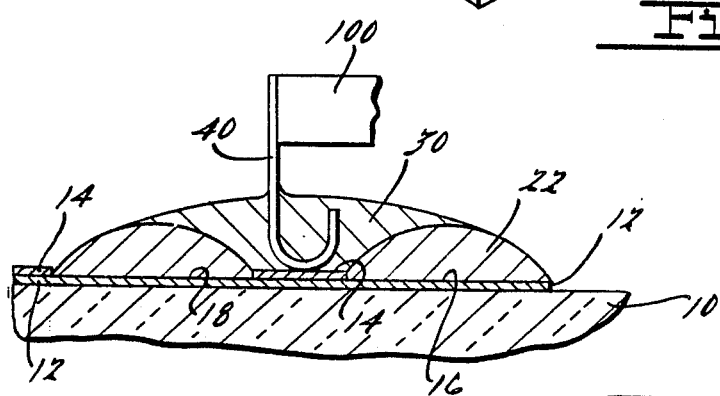
FIG. 5 illustrates a cross-sectional view of a leaded electrical component subsequent to being forced through the low temperature solder paste and being guided into position by the high temperature solder mounds.

Subsequent to the deposition of the low temperature solder over and between the adjacent mounds 20 and 22, electrical components may be mounted directly to the board 10. In FIG. 5, a leaded device 100 such as is commonly found in the art as having "J" shaped leads 40 which extend as electrical terminals for connection to the printed circuit board and are disposed in a pattern corresponding to the location of the valleys in Groups A-D. The terminals 40 are mated to the high temperature solder mounds 20 and 22 when they are compressibly forced downward through the low temperature solder paste 30. Since the low temperature solder paste 30 is relatively soft at this stage of the process, the material is merely displaced by the movement of the terminal 40 as it is forced through the material. Since the mounds 20 and 22 are hardened, they act to guide and align the individual terminals 40 as they are mated into place.

As mentioned above, a typical electrical conductor 12 on a substrate 10 may be formed of a palladium/silver alloy for which high tin content solder has poor adhesion characteristics. On the other hand, the high tin content solder is ideal for temporary adhesion of a terminal of an electrical device prior to curing the solder. Therefore the present invention functions for provide a good adhesion between the electrical conductor 12 through the use of the high temperature and low tin content solder mounds 20 and 22. The low temperature solder paste 30 having a high tin content is then used for interconnection between the electrical terminal of the electronic component and the high temperature solder mounds 20 and 22.

Subsequent to the mating of the terminal portions of the electrical component to the high temperature solder mound through the low temperature solder paste 30, the low temperature solder paste is heated to its melting temperature and subsequently cooled to provide an reflowed solder bond therebetween.

Figure 6:
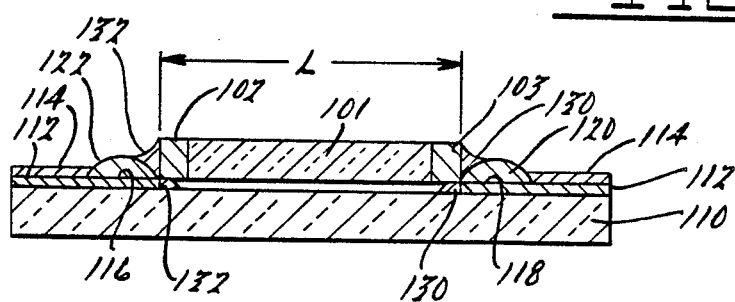
FIG. 6 illustrates a surface mounted electrical component precisely located between high temperature solder mounds and bonded thereto by a low temperature solder paste coating.

In FIG. 6, an electrical component 101, commonly termed a surface mounted device "SMD" or a leadless chip component "LCC", is shown bonded at its electrically conducting terminal ends 102 and 103 to high temperature solder mounds 120 and 122 formed onto respective electrical conductors 116 and 118 in a manner as described above. In this case, the areas 116 and 118 of electrical conductors 112 are defined to receive the high temperature solder mounds 120 and 122 by the dielectric material 114 and are separated a distance "L" that corresponds to the length of the electrical component 101. The dielectric material 114 is deposited onto the electrical conductors 112 so as to define the areas 116 and 118 prior to deposition of the high temperature solder mounds 120 and 122. Subsequent to the deposition of the high temperature solder mounds 120 and 122, the low temperature solder paste is coated onto the mounds at 130 and 132. The terminals 102 and 103 of the component 101 are mated with the high temperature solder mound by being compressibly forced towards the dielectric surface of the substrate 110 and are guided into position by the rounded and rigid surfaces of the high temperature solder mounds 120 and 122. The low temperature solder paste at 130 and 132 forms a temporary adhesive of the mated element and provides a permanent bond when the low temperature solder paste is heated above its melt temperature and subsequently cooled.

Figure 7:
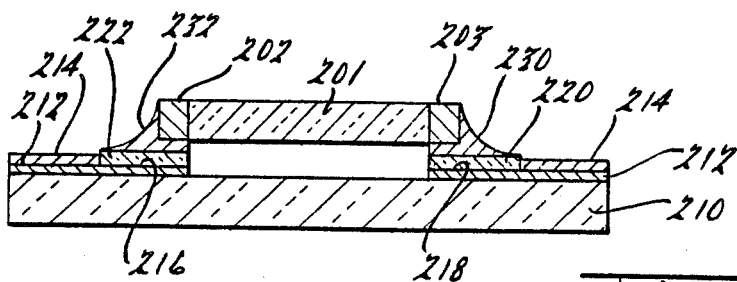
FIG. 7 illustrates the use of the dual solder method of the present invention to provide an improved solder connection to a surface mounted electrical component.

In FIG. 7, a leadless chip component 201 shown with electrically conducting terminals 202 and 203 bonded with low temperature solder 230 and 232 to high temperature solder pads 220 and 222 formed on defined areas 216 and 218 of the electrical conductors 212. The differences between the mounting technique employed in FIG. 7 and that in FIG. 6 are that the high temperature solder pads 220 and 222 are separated by a distance that is less than the length between the ends of the leadless chip component 201 and the mounds are less pronounced so as to provide fairly flat mounting pads to which the terminal ends may be mounted and bonded via the low temperature solder paste.

The advantages of the present invention in each of the methods described with respect to FIGS. 6 and 7 are found in utilizing the favorable adhesion qualities of the low tin content solder for interconnection to the electrical conductor 112 (212) at areas 116 (216) and 118 (218) while utilizing the temporary adhesion properties provided by the high tin content solder paste prior to forming the subsequent electrical connection between the end terminals of the components and the high temperature solder pads. In addition, the techniques employed with respect to FIG. 6 provides for an alignment and guiding feature when the leadless chip component is placed onto the board between the mounds 120 and 122.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. A process for connecting electrically conducting terminals of electrical components to printed circuit conductors on the dielectric surface of a substrate, comprising the steps of:
    forming a predetermined conductor pattern on said substrate in such a manner as to provide a pair of closely adjacent areas;
    depositing mounds of a solder having relatively high melting temperature that is above a first predetermined level onto said adjacent areas of said conductor pattern and forming a valley that separates said mounds with a portion of the dielectric surface of said substrate ;
    depositing a coating of a solder paste material having relatively low melting temperature that is below said first predetermined level onto said mounds of high temperature solder and filling said valley on said dielectric surface;
    mating the terminal portion of an electrical component with a high temperature solder mound by compressibly forcing said terminal portion through said low temperature solder paste coating;
    heating said low temperature solder paste coating to a temperature that is above its melting temperature; and
    cooling said low temperature solder paste to a temperature below its melting temperature to thereby electrically and physically bond said terminal to said high temperature solder mound;
    wherein said step of mating utilizes said closely adjacent high temperature solder mounds to guide and center a compressibly forced terminal into position for bonding to both mounds.

2. A process as in claim 1, wherein said first predetermined temperature level is above 300° C.

3. A process as in claim 2, wherein said melting temperature of said solder paste is below 200° C.

4. A process as in claim 3, wherein said high lemperature solder material is provided having a composition that includes tin in the range of 5 to 10% lead in the corresponding range of 95 to 88% and silver in the corresponding range of 0 to 2%.

5. A process as in claim 4, wherein said low temperature solder paste material is provided having a composition that includes approximately 60% tin, 40% lead and tin in the range of from 0 to 2%.

6. A process for connecting electrically conducting terminals of electrical components to printed circuit conductors on the dielectric surface of a substrate, comprising the steps of:
    forming a predetermined conductor pattern on said substrate;
    depositing mounds of a solder, having a relatively high melting temperature that is above a first predetermined level, onto preselected areas of said conductor pattern;
    depositing a coating of a solder paste material, having a relatively low melting temperature that is below said first predetermined level, onto said mounds of high temperature solder and portions of said conductor pattern;
    mating the terminal portion of an electrical component with a high temperature solder mound by compressibly forcing said terminal portion through said low temperature solder paste coating;
    heating said low temperature solder paste coating to a temperature that is above its melting temperature;
    cooling said low temperature solder paste to a temperature below its melting temperature to thereby electrically and physically bond said terminal to said high temperature solder mound;
    wherein said printed circuit pattern is formed in such a manner as to provide a pair of adjacent areas separated by a predetermined portion of the dielectric surface corresponding to the predetermined distance between terminals on a selected component to be connected therebetween, said high temperature solder mounds are deposited on said adjacent areas separated by said dielectric surface and said step of mating utilizes said adjacent mounds to guide and locate said terminals of said selected component prior to said step of heating said low temperature solder paste.

7. A process as in claim 6, wherein said first predetermined temperature level is above 300° C.

8. A process as in claim 7, wherein said melting temperature of said solder paste is below 200° C.

9. A process as in claim 8, wherein said high temperature solder material is provided having a composition that includes tin in the range of 5 to 10%, lead in the corresponding range of 95 to 88% and silver in the corresponding range of 0 to 2%.

10. A process as in claim 9, wherein said low temperature solder paste material is provided having a composition that includes approximately 60% tin, 40% lead and tin in the range of from 0 to 2%.

* * * * *